(12) United States Patent
Stroffolino

(10) Patent No.: US 10,057,532 B2
(45) Date of Patent: Aug. 21, 2018

(54) METHODS AND SYSTEMS FOR ENVIRONMENTAL NOISE COMPENSATION

(71) Applicant: Comcast Cable Communications, LLC, Philadelphia, PA (US)

(72) Inventor: Philip John Stroffolino, Media, PA (US)

(73) Assignee: Comcast Cable Communications, LLC, Philadelphia, PA (US)

( * ) Notice: Subject to any disclaimer, the term of this patent is extended or adjusted under 35 U.S.C. 154(b) by 0 days.

(21) Appl. No.: 15/088,633

(22) Filed: Apr. 1, 2016

(65) Prior Publication Data

US 2017/0289486 A1    Oct. 5, 2017

(51) Int. Cl.
| | |
|---|---|
| H03G 3/20 | (2006.01) |
| H04N 5/445 | (2011.01) |
| H04N 17/00 | (2006.01) |
| H03G 3/24 | (2006.01) |
| H03G 3/32 | (2006.01) |

(52) U.S. Cl.
CPC ....... H04N 5/44513 (2013.01); H04N 17/004 (2013.01); *H03G 3/24* (2013.01); *H03G 3/32* (2013.01); *H04N 2005/4453* (2013.01); *H04N 2005/44526* (2013.01); *H04N 2017/006* (2013.01)

(58) Field of Classification Search
CPC .. H03G 3/32; H03G 3/24; H04N 2005/44526; H04N 2005/4453; H04N 2017/006

USPC ................... 381/56–57, 104, 107
See application file for complete search history.

(56) References Cited

U.S. PATENT DOCUMENTS

| | | | | |
|---|---|---|---|---|
| 8,873,769 | B2 * | 10/2014 | Petersen | H04R 3/005 381/122 |
| 2010/0146445 | A1 * | 6/2010 | Kraut | H04N 5/60 715/821 |
| 2015/0304785 | A1 * | 10/2015 | Gan | H04R 29/00 381/56 |
| 2016/0014476 | A1 * | 1/2016 | Caliendo, Jr. | H04N 21/8133 725/32 |
| 2016/0330396 | A1 * | 11/2016 | Garcia Navarro | G10L 21/10 |
| 2017/0169827 | A1 * | 6/2017 | Barreira Avegliano | G10L 15/32 |

\* cited by examiner

*Primary Examiner* — Disler Paul
(74) *Attorney, Agent, or Firm* — Ballard Spahr LLP

(57) ABSTRACT

Some aspects of the disclosure relate to a system and methods for monitoring an audio signal that may comprise one or more device audio components, e.g., from a device presenting content and an ambient audio component. The system can determine the ambient audio component of the audio signal, and can determine whether the ambient audio component has satisfied an ambient audio component threshold. If the ambient audio component threshold has been satisfied, the system can cause the device to display a visual representation of the device audio component, such as presenting text corresponding to speech of the audio component.

20 Claims, 6 Drawing Sheets

METHODS AND SYSTEMS FOR ENVIRONMENTAL NOISE COMPENSATION

BACKGROUND

Content such as entertainment, news programs, and the like, convey a stream of information to a user. The content typically contains audio information. Users can periodically be interrupted by, for example, loud and relatively prolonged periods of environmental noise (e.g., trains, vacuums cleaners, loud children, etc.) making it difficult or impossible to comprehend the audio information. Currently, closed captioning functionality may be available for some content to alleviate lack of comprehension caused by the inability to discern the audio information versus, or due to, environmental noise. Activation of a closed captioning function, however, requires affirmative action on the part of the user (e.g., navigation of on-screen menus), which some users may find onerous, particularly when the lack of comprehension is caused by relatively brief periods of noise, such as noise coming from a car or a vacuum. These and other shortcomings are addressed in the present disclosure.

SUMMARY

It is to be understood that both the following general description and the following detailed description are exemplary and explanatory only and are not restrictive. Methods and systems for environmental noise compensation are disclosed herein.

A device can monitor an audio signal that includes both a device audio component generated by a device displaying content to a user and an ambient audio component. For example, the audio signal can be monitored using a microphone, volume unit (VU) meter, or other similar devices. The device can automatically cause display of audio transcription information (e.g., closed caption information) on a device displaying content to a user in response to a determination that a volume of the ambient audio component satisfies (e.g., exceeds) an ambient audio component threshold. In some aspects, the ambient audio component threshold can comprise an ambient noise threshold related to a volume of the ambient noise component and a time threshold related to a duration of the ambient noise component. In some aspects, the ambient audio component threshold can be dynamically selected based on a volume of the device audio component.

Additional advantages will be set forth in part in the description which follows or may be learned by practice. The advantages will be realized and attained by means of the elements and combinations particularly pointed out in the appended claims.

BRIEF DESCRIPTION OF THE DRAWINGS

The accompanying drawings, which are incorporated in and constitute a part of this specification, illustrate embodiments and together with the description, serve to explain the principles of the methods and systems.

DETAILED DESCRIPTION

Figure 1:
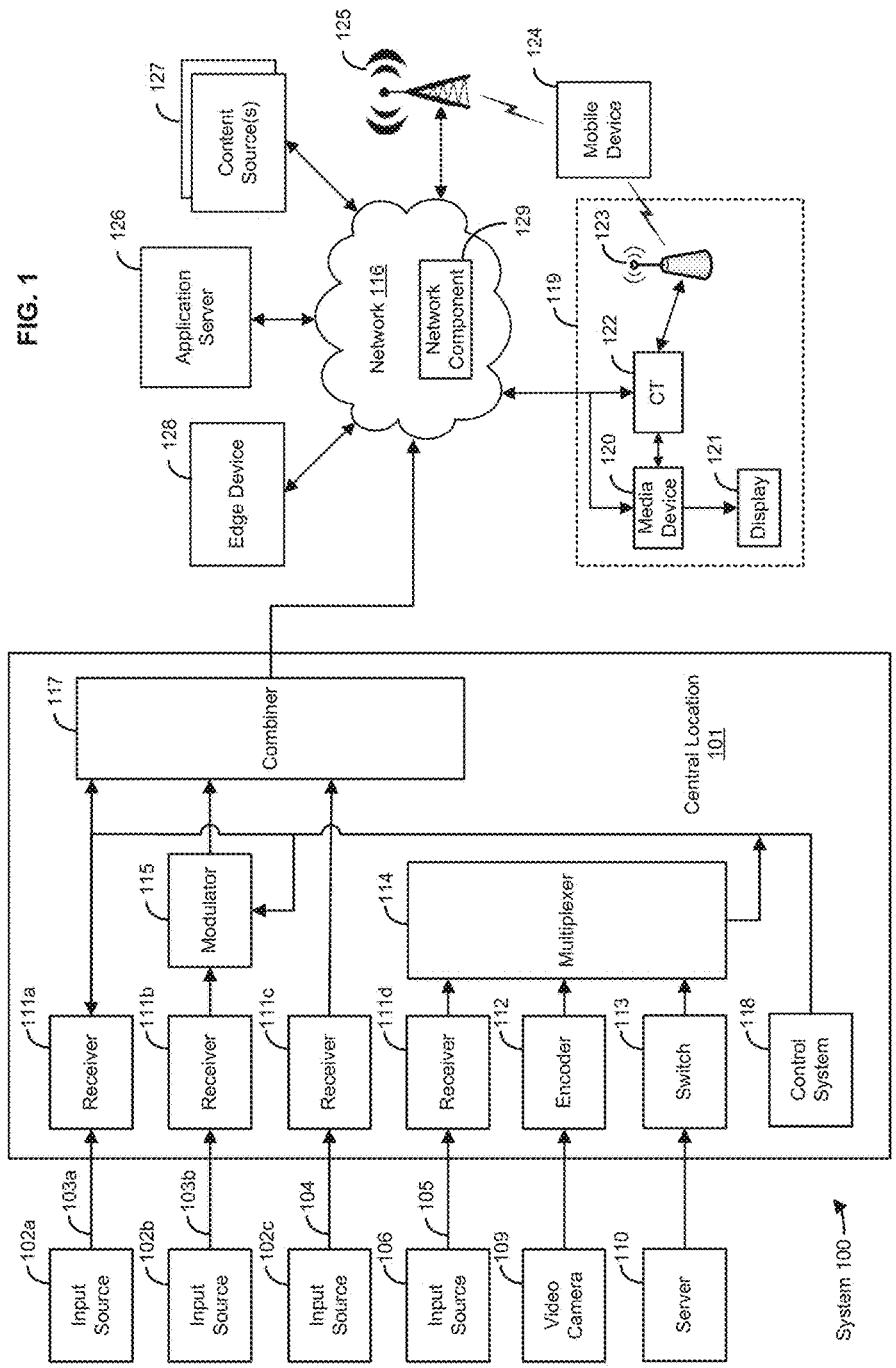
FIG. 1 is block diagram illustrating various aspects of an exemplary system.

Before the present methods and systems are disclosed and described, it is to be understood that the methods and systems are not limited to specific methods, specific devices or components, or to particular implementations. It is also to be understood that the terminology used herein is for the purpose of describing particular embodiments only and is not intended to be limiting.

As used in the specification and the appended claims, the singular forms "a," "an," and "the" include plural referents unless the context clearly dictates otherwise. Ranges may be expressed herein as from "about" one particular value, and/or to "about" another particular value. When such a range is expressed, another embodiment includes from the one particular value and/or to the other particular value. Similarly, when values are expressed as approximations, by use of the antecedent "about," it will be understood that the particular value forms another embodiment. It will be further understood that the endpoints of each of the ranges are significant both in relation to the other endpoint, and independently of the other endpoint.

"Optional" or "optionally" means that the subsequently described event or circumstance may or may not occur, and that the description includes instances where said event or circumstance occurs and instances where it does not.

Throughout the description and claims of this specification, the word "comprise" and variations of the word, such as "comprising" and "comprises." means "including but not limited to," and is not intended to exclude, for example, other components, integers or steps. "Exemplary" means "an example of" and is not intended to convey an indication of a preferred or ideal embodiment. "Such as" is not used in a restrictive sense, but for explanatory purposes.

Disclosed are components that can be used to perform the disclosed methods and systems. These and other components are disclosed herein, and it is understood that when combinations, subsets, interactions, groups, etc. of these components are disclosed that while specific reference of each various individual and collective combinations and permutation of these may not be explicitly disclosed, each is specifically contemplated and described herein, for all methods and systems. This applies to all aspects of this application including, but not limited to, steps in disclosed methods. Thus, if there are a variety of additional steps that can be performed it is understood that each of these additional steps can be performed with any specific embodiment or combination of embodiments of the disclosed methods.

The present methods and systems may be understood more readily by reference to the following detailed description of preferred embodiments and the examples included therein and to the Figures and their previous and following description.

As will be appreciated by one skilled in the art, the methods and systems may take the form of an entirely hardware embodiment, an entirely software embodiment, or an embodiment combining software and hardware aspects. Furthermore, the methods and systems may take the form of a computer program product on a computer-readable storage medium having computer-readable program instructions (e.g., computer software) embodied in the storage medium. More particularly, the present methods and systems may take the form of web-implemented computer software. Any suitable computer-readable storage medium may be utilized including hard disks. CD-ROMs, optical storage devices, or magnetic storage devices.

Embodiments of the methods and systems are described below with reference to block diagrams and flowchart illustrations of methods, systems, apparatuses and computer program products. It will be understood that each block of the block diagrams and flowchart illustrations, and combinations of blocks in the block diagrams and flowchart illustrations, respectively, can be implemented by computer program instructions. These computer program instructions may be loaded onto a general purpose computer, special purpose computer, or other programmable data processing apparatus to produce a machine, such that the instructions which execute on the computer or other programmable data processing apparatus create a means for implementing the functions specified in the flowchart block or blocks.

These computer program instructions may also be stored in a computer-readable memory that can direct a computer or other programmable data processing apparatus to function in a particular manner, such that the instructions stored in the computer-readable memory produce an article of manufacture including computer-readable instructions for implementing the function specified in the flowchart block or blocks. The computer program instructions may also be loaded onto a computer or other programmable data processing apparatus to cause a series of operational steps to be performed on the computer or other programmable apparatus to produce a computer-implemented process such that the instructions that execute on the computer or other programmable apparatus provide steps for implementing the functions specified in the flowchart block or blocks.

Accordingly, blocks of the block diagrams and flowchart illustrations support combinations of means for performing the specified functions, combinations of steps for performing the specified functions and program instruction means for performing the specified functions. It will also be understood that each block of the block diagrams and flowchart illustrations, and combinations of blocks in the block diagrams and flowchart illustrations, can be implemented by special purpose hardware-based computer systems that perform the specified functions or steps, or combinations of special purpose hardware and computer instructions.

Disclosed are systems and methods that can be used to automatically activate display of audio transcription information (e.g., closed caption information) based on a noise level in an area surrounding a display device (e.g., a television, laptop computer, tablet computer, smartphone, etc.). A user device (e.g., the display device, a set top box, etc.) can monitor an audio signal. The audio signal can comprise a device audio component created by the device displaying the content (e.g., the display device) and/or an ambient audio component present in the area of the display device (e.g., other noise produced within a room, excluding the device audio component). The audio signal can be monitored using a loudness measuring device, such as a sound level meter, a Peak programme meter (PPM), a volume unit (VU) meter, a loudness meter, a microphone, or the like. In some examples, the display device can comprise the loudness measuring device. In other examples, the loudness measuring device can be a device separate from the display device, such as a remote control device in communication with the display device, a separate device disposed near the display device and in communication with the display device (either directly or via a network), or the like.

The user device can determine the ambient audio component of the audio signal. For example, the user device can be connected to an audio output of the display device to receive a waveform representing the device audio component. In an example, the waveform representing the device audio component can be subtracted from the audio signal to determine the ambient audio component. For example, subtracting the device audio component can be performed by inverting a phase of the waveform representing the device audio component and combining the inverted device audio component and the audio signal.

The user device can determine whether a sound level of the ambient audio signal satisfies an ambient audio component threshold sound level. When the sound level of the ambient audio component satisfies the ambient audio component threshold (e.g., the sound level exceeds a predefined decibel level), the user device can activate display of the audio transcription information.

The user device can monitor the audio signal periodically (e.g., once per second, etc.). When the sound level of the ambient audio component does not satisfy the ambient audio component threshold for a predefined time period, the user device can deactivate display of the audio transcription information.

FIG. 1 illustrates various aspects of an exemplary system in which the present methods and systems can operate. Those skilled in the art will appreciate that present methods may be used in systems that employ both digital and analog equipment. One skilled in the art will appreciate that provided herein is a functional description and that the respective functions can be performed by software, hardware, or a combination of software and hardware.

A system 100 can comprise a central location 101 (e.g., a headend), which can receive content (e.g., data, input programming, and the like) from multiple sources. The central location 101 can combine the content from the various sources and can distribute the content to user (e.g., subscriber) locations (e.g., location 119) via a distribution system 116.

The central location 101 can receive content from a variety of sources 102a, 102b, 102c. The content can be transmitted from the source to the central location 101 via a variety of transmission paths, including wireless (e.g. satellite paths 103a, 103b) and a terrestrial path 104. The central location 101 can also receive content from a direct feed source 106 via a direct line 105. Other input sources can comprise capture devices such as a video camera 109 or a server 110. The signals provided by the content sources can include a single content item or a multiplex that includes several content items.

The central location 101 can comprise one or a plurality of receivers 111a, 111b, 111c, 111d that are each associated with an input source. For example, MPEG encoders such as an encoder 112 are included for encoding local content or a video camera 109 feed. A switch 113 can provide access to the server 110, which can be a Pay-Per-View server, a data server, an internet router, a network system, a phone system, and the like. Some signals may require additional processing, such as signal multiplexing, prior to being modulated. Such multiplexing can be performed by a multiplexer (mux) 114.

The central location 101 can comprise one or a plurality of modulators 115 for interfacing to a network 116. The modulators 115 can convert the received content into a modulated output signal suitable for transmission over a network 116. The output signals from the modulators 115 can be combined, using equipment such as a combiner 117, for input into the network 116. In an example, the network 116 can comprise a content delivery network, a content access network, and/or the like. For example, the network 116 can be configured to provide content from a variety of sources using a variety of network paths, protocols, devices, and/or the like. The content delivery network and/or content access network can be managed (e.g., deployed, serviced) by a content provider, a service provider, and/or the like.

A control system 118 can permit a system operator to control and monitor the functions and performance of the system 100. The control system 118 can interface, monitor, and/or control a variety of functions, including, but not limited to, the channel lineup for the television system, billing for each user, conditional access for content distributed to users, and the like. The control system 118 can provide input to the modulators for setting operating parameters, such as system specific MPEG table packet organization or conditional access information. The control system 118 can be located at the central location 101 or at a remote location.

The network 116 can distribute signals from the central location 101 to user locations, such as a user location 119. The network 116 can comprise an optical fiber network, a coaxial cable network, a hybrid fiber-coaxial network, a wireless network, a satellite system, a direct broadcast system, an Ethernet network, a high-definition multimedia interface network, universal serial bus network, or any combination thereof.

A multitude of users can be connected to the network 116 at one or more of the user locations. At the user location 119, a media device 120 can demodulate and/or decode, if needed, the signals for display on a display device 121, such as on a television set (TV) or a computer monitor. For example, the media device 120 can comprise a demodulator, decoder, frequency tuner, and/or the like. The media device 120 can be directly connected to the network (e.g., for communications via in-band and/or out-of-band signals of a content delivery network) and/or connected to the network 116 via a communication terminal 122 (e.g., for communications via a packet switched network). The media device 120 can comprise a set-top box, a digital streaming device, a gaming device, a media storage device, a digital recording device, a combination thereof, and/or the like. The media device 120 can comprise one or more applications, such as content viewers, social media applications, news applications, gaming applications, content stores, electronic program guides, and/or the like. Those skilled in the art will appreciate that the signal can be demodulated and/or decoded in a variety of equipment, including the communication terminal 122, a computer, a TV, a monitor, or satellite dish.

The communication terminal 122 can be located at the user location 119. The communication terminal 122 can be configured to communicate with the network 116. The communications terminal 122 can comprise a modem (e.g., cable modem), a router, a gateway, a switch, a network terminal (e.g., optical network unit), and/or the like. The communications terminal 122 can be configured for communication with the network 116 via a variety of protocols, such as internet protocol, transmission control protocol, file transfer protocol, session initiation protocol, voice over internet protocol, and/or the like. For example, for a cable network, the communication terminal 122 can be configured to provide network access via a variety of communication protocols and standards, such as Data Over Cable Service Interface Specification.

The user location 119 can comprise a first access point 123, such as a wireless access point. The first access point 123 can be configured to provide one or more wireless networks in at least a portion of the user location 119. The first access point 123 can be configured to provide access to the network 116 to devices configured with a compatible wireless radio, such as a mobile device 124, the media device 120, the display device 121, or other computing devices (e.g., laptops, sensor devices, security devices). For example, the first access point 123 can provide a user managed network (e.g., local area network), a service provider managed network (e.g., public network for users of the service provider), and/or the like. It should be noted that in some configurations, some or all of the first access point 123, the communication terminal 122, the media device 120, and the display device 121 can be implemented as a single device.

The user location 119 may not be fixed. By way of example, a user can receive content from the network 116 on the mobile device 124. The mobile device 124 can comprise a laptop computer, a tablet device, a computer station, a personal data assistant (PDA), a smart device (e.g., smart phone, smart apparel, smart watch, smart glasses), GPS, a vehicle entertainment system, a portable media player, a combination thereof, and/or the like. The mobile device 124 can communicate with a variety of access points (e.g., at different times and locations or simultaneously if within range of multiple access points). For example, the mobile device 124 can communicate with a second access point 125. The second access point 125 can be a cell tower, a wireless hotspot, another mobile device, and/or other remote access point. The second access point 125 can be within range of the user location 119 or remote from the user location 119. For example, the second access point 125 can be located along a travel route, within a business or residence, or other useful locations (e.g., travel stop, city center, park).

In an aspect, the system 100 can comprise an application device 126. The application device 126 can be a computing device, such as a server. The application device 126 can provide services related to applications. For example, the application device 126 can comprise an application store. The application store can be configured to allow users to purchase, download, install, upgrade, and/or otherwise manage applications. For example, the application device 126 can be configured to allow users to download applications to a device, such as the mobile device 124, communications terminal 122, the media device 120, the display device 121, and/or the like. The application device 126 can run one or more application services to provide data, handle requests, and/or otherwise facilitate operation of applications for the user.

The system 100 can comprise one or more content source(s) 127. The content source(s) 127 can be configured to provide content (e.g., video, audio, games, applications, data) to the user. The content source(s) 127 can be configured to provide streaming media, such as on-demand content (e.g., video on-demand), content recordings, and/or the like. For example, the content source(s) 127 can be managed by third party content providers, service providers, online content providers, over-the-top content providers, and/or the like. The content can be provided via a subscription, by individual item purchase or rental, and/or the like. The content source(s) 127 can be configured to provide the content via a packet switched network path, such as via an internet protocol (IP) based connection. In an example, the content can be accessed by users via applications, such as mobile applications, television applications, set-top box applications, gaming device applications, and/or the like. An example application can be a custom application (e.g., by content provider, for a specific device), a general content browser (e.g., web browser), an electronic program guide, and/or the like.

The system 100 can comprise an edge device 128. The edge device 128 can be configured to provide content, services, and/or the like to the user location 119. For example, the edge device 128 can be one of a plurality of edge devices distributed across the network 116. The edge device 128 can be located in a region proximate to the user location 119. A request for content from the user can be directed to the edge device 128 (e.g., due to the location of the edge device and/or network conditions). The edge device 128 can be configured to package content for delivery to the user (e.g., in a specific format requested by a user device), provide the user a manifest file (e.g., or other index file describing segments of the content), provide streaming content (e.g., unicast, multicast), provide a file transfer, and/or the like. The edge device 128 can cache or otherwise store content (e.g., frequently requested content) to enable faster delivery of content to users.

In an example, the network 116 can comprise a network component 129. The network component 129 can comprise any device, module, and/or the like communicatively coupled to the network 116. For example, the network component 129 can comprise a router, a switch, a splitter, a packager, a gateway, a encoder, a storage device, a multiplexer, a network access location (e.g., tap), physical link, and/or the like.

In an exemplary embodiment, the methods and systems disclosed can be located downstream of the network 116. For example, the methods and systems disclosed can be located primarily within the user location 119 (e.g., one or more of the media device 120, the display 121, and/or the communication terminal 122), the mobile device 124, and the like. A user device (e.g., the media device 120, the display 121, the communication terminal 122, and/or the mobile device 124) can be used to display content comprising at least an audio component and an audio transcription component. The content can be presented (e.g., displayed) according to user preferences, with the audio transcription component typically not displayed unless the audio portion is difficult for the user to hear and/or comprehend.

The user device can monitor an audio signal at the user location (e.g., the user premises 119). In an example, the audio signal can comprise a device audio component (e.g., an audio component of the content as presented by the user device or an expected audio component representing audio expected to be presented by the user device) and an ambient audio component (e.g., other noise present at the user location. In an example, the user device can comprise a monitoring device for monitoring the audio signal (e.g., a microphone, a sound level meter, a Peak programme meter (PPM), a volume unit (VU) meter, a loudness meter, etc.). In an example, the monitoring device can be used to monitor one or more of sound intensity, loudness, sound pressure, volume, and the like. As an example, a microphone disposed within a remote control device associated with a television or set top box can be used monitor the audio signal. In some examples, the monitoring device can be integrated into the user device. In other examples, the monitoring device can be separate from the user device, disposed in the vicinity of at least the display 121 and in communication with the user device.

The user device can optionally determine the ambient audio component of the audio signal. In some aspects, the user device can receive a waveform representing the device audio component directly. For example, the device audio component can be received as an output from the display 121, the mobile device 124, or the like. For example, the device audio component can be received via a physical connection between the user device and the display device (e.g., using a transfer cable, such as an HDMI cable, a digital audio cable, or the like). As one example, a loudness of the waveform representing the device audio component can be determined based on the waveform, and a loudness of the ambient audio component can be determined based on a difference between a loudness of the audio signal and a loudness of the device audio component. As another example, when a microphone is used to monitor the audio signal, a waveform representing the audio signal can be produced. The waveform representing the device audio component can be subtracted from the waveform representing the audio signal, leaving a waveform representing the ambient audio component. Subtraction of the device audio component waveform from the audio signal waveform results in a curve, and an area under the curve provides an indication of the ambient audio component waveform.

The user device can also determine if the ambient audio component satisfies (e.g., exceeds) an ambient audio component threshold. In an example, the ambient audio component threshold can be a predetermined threshold value. In another example, the ambient audio component threshold can be dynamically selected based on, for example, a time duration of the ambient sound, a noise level of the device audio component, and combinations thereof. For example, an average sampled volume of the audio signal can be compared to an expected average volume (e.g., a recent average volume from the device audio component). The expected average volume can be recalibrated based on changes made to an audio output of the device presenting content (e.g., a manual increase or decrease in program volume, a change of content being presented, etc.) to avoid confusing an intentional adjustment of the content with an increase in environmental noise. In some examples, the comparison can also be recalibrated based on empirical testing.

In response to determining that the ambient audio component satisfies the ambient audio component threshold, the user device can, in some examples, activate a closed caption feature of the user device to display the audio transcription information. In other examples, the user device can send a notification to a display device to enable an audio transcription function in response to determining that the ambient audio component satisfies the ambient audio component threshold.

Figure 2:
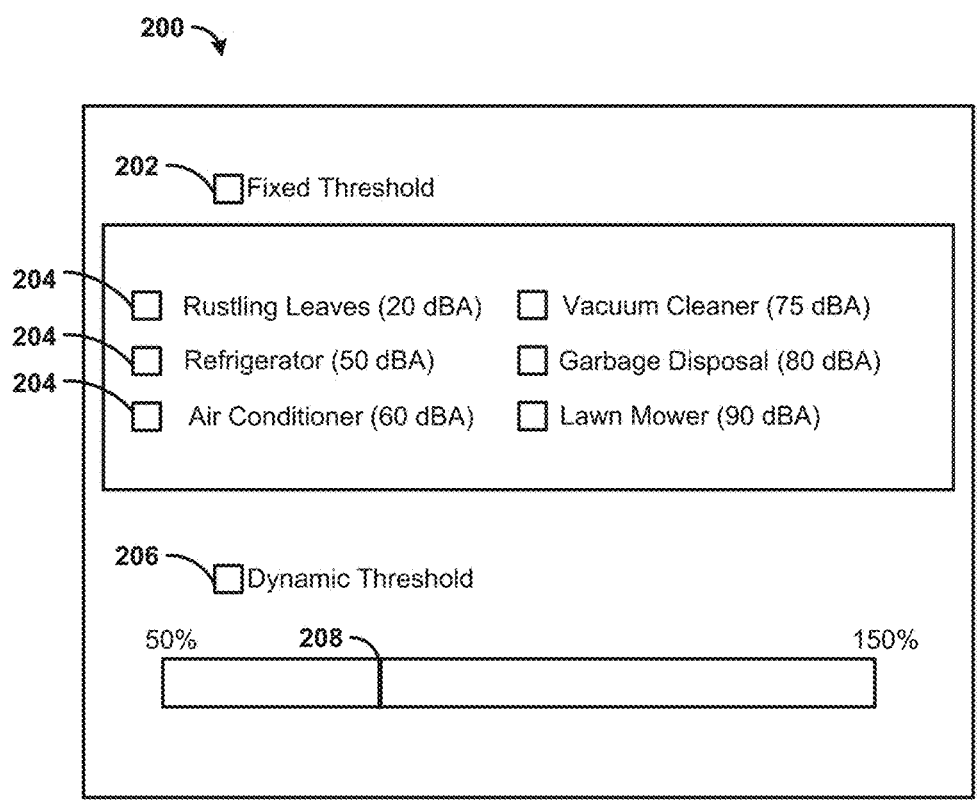
FIG. 2 is an illustration of a sample interface.

FIG. 2 shows an example interface 200 used to specify the ambient audio component threshold. The user can first select between a fixed threshold and a dynamic threshold by selecting one of the selection boxes 202 and 204, respectively. If the user selects a fixed threshold (selection box 202), the user can further identify a volume level by selecting from a list of common volume levels (e.g., light traffic, air conditioner, refrigerator, vacuum cleaner, garbage disposal, lawn mower, etc.) in menu 206. In some examples, one or more (e.g., each) of the common volume levels can comprise a decibel level and a description of a common household object that produces sound at that volume level. If the user selects a dynamic threshold (selection box 204), the user can further define the threshold based on a percentage of the device audio (e.g., a selection between 50% and 150%, as shown in FIG. 2) via a sliding selector 208.

Figure 3:
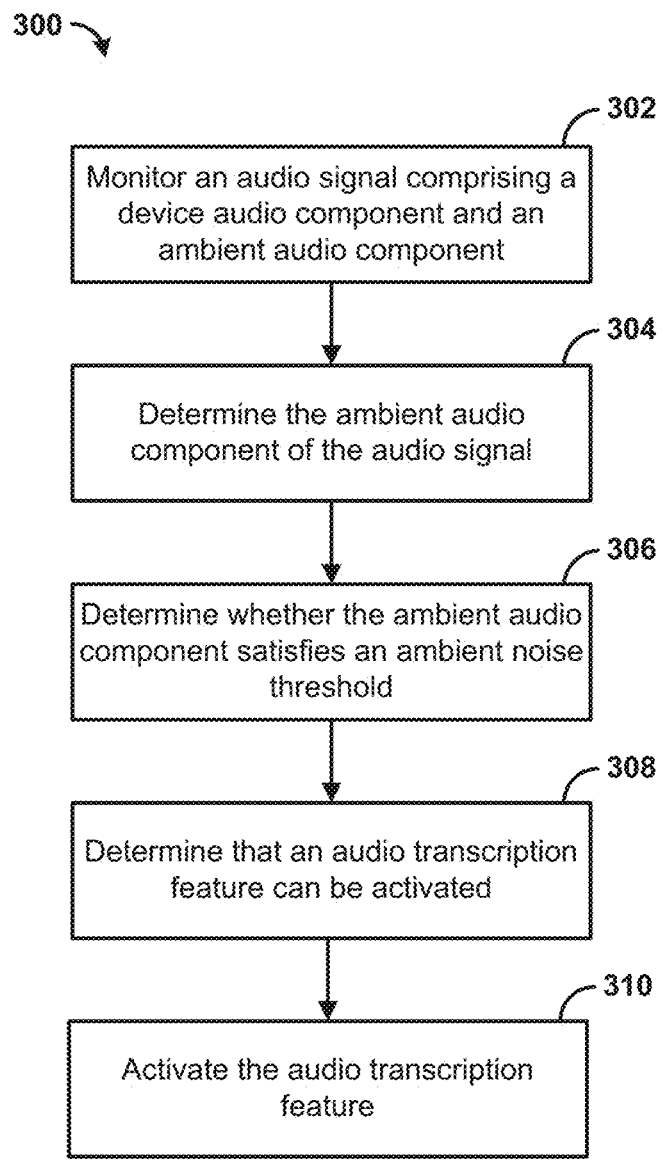
FIG. 3 is a flowchart illustrating an example method.

FIG. 3 shows an exemplary method 300. At step 302, a system comprising a monitoring device can monitor an audio signal. In an example, a user device can comprise the monitoring device and/or one or more of the media device 120, the display 121, the communication terminal 122, the mobile device 124, a set top box, a general or dedicated microphone or other audio capture device, and the like. In some examples, the monitored audio signal can comprise a device audio component from a device playing content (e.g., the display 121, the mobile device 124, etc.) and an ambient audio component from devices and/or persons proximate to (e.g., within hearing distance of) a user. In other embodiments, the monitored audio can comprise ambient audio only (e.g., by positioning an audio capture device(s) to be exposed to only ambient noise, or by filtering out a device audio component, etc.) In some aspects, the monitoring device can monitor the audio signal substantially continuously. In other aspects, the monitoring device can monitor the audio signal periodically (e.g., once per millisecond, once per second, etc.). Sampling less frequently can provide greater energy efficiency. In other aspects, the monitoring device can monitor the audio signal in response to a user request.

The monitoring device can comprise one or more of a sound level meter, a Peak programme meter (PPM), a volume unit (VU) meter, a loudness meter, a microphone, or the like. In some aspects, the monitoring device can be disposed within the user device. In other aspects, the monitoring device can be remote from the user device (e.g., housed within a remote control device used to control the display 121). The monitoring device can be in signal communication with the user device using, for example, wired communication, Wi-Fi, Bluetooth Low Energy (BLE), radio frequency (RF), or other wireless communication methods. The monitoring device can be disposed within a remote control device associated with the user device. In some examples, the monitoring device can be disposed relatively proximate (e.g., within about 15 feet) to a location of the user.

In step 304, the monitoring device can determine the ambient audio component of the audio signal. In some aspects, determining the ambient audio component can comprise determining a volume of the ambient audio component.

Determining the ambient audio component can comprise removing the device audio component from the audio signal, which comprises the ambient audio component and the device audio component. For example, the monitoring device can receive the device audio component directly from the display 121 via a physical connection, such as an HDMI connection, a digital audio connection, or the like. The device audio component can be subtracted from the audio signal, leaving only the ambient audio component. For example, the device audio component received from the display 121 can be phase-inverted and combined with the audio signal to remove the device audio component based on the audio principle of phase cancellation or destructive interference, whereby two audio signals that are "out of phase," or inverted with respect to one another, cancel each other out. For example, combining the audio signal (e.g., the device audio component and the ambient audio component) with the phase-inverted device audio component causes the device audio component and the phase-inverted device audio component to cancel each other out, leaving only the ambient audio component.

The device audio component can typically comprise a relatively consistent volume. Accordingly, an average of the audio signal can be used to approximate the device audio component of the audio signal. For example, the user device can calculate the average of the audio signal. As a specific example, the average audio signal can be calculated as a root mean square (RMS) average of the audio signal calculated over a predefined amount of time (e.g., one minute). In another example, determining the ambient audio component can comprise approximating the ambient audio component by subtracting the calculated average audio signal from the audio signal.

In step 306, the monitoring device can determine whether the ambient audio component determined in step 304 satisfies (e.g., exceeds) an ambient audio component threshold. In some examples, the ambient audio component satisfies the ambient audio component threshold when a volume of the ambient audio component (e.g., an ambient noise level) exceeds a decibel value (e.g., an ambient noise threshold) specified by the ambient audio component threshold. In some examples, the ambient audio component threshold can be a predefined absolute value (e.g., 60 dBA). In other examples, the ambient audio component threshold value can be set dynamically, for example, as a percentage of the device audio component volume. In some examples, there can be a difference between the average program audio being output, and an average sampled environmental audio. The difference can be substantially constant. For example, the difference can be based on a difference between an environmental sampler (e.g., the monitoring device) and the speakers. The monitoring device can monitor the difference to detect an abrupt change in the difference (e.g., presence of environmental noise).

Determining whether the ambient audio component satisfies the ambient component threshold can comprise, in response to determining that the ambient noise level satisfies (e.g., exceeds) the ambient noise threshold, determining whether a time threshold has been satisfied.

The monitoring device can determine that a time threshold is satisfied when the ambient noise level exceeds the ambient noise threshold for a threshold amount of time. The threshold amount of time can be a dynamic amount of time. For example, the amount of time can be dependent on an absolute value of the ambient noise level, an absolute amount by which the ambient noise level exceeds the ambient noise threshold, a percentage by which the ambient noise level exceeds the ambient noise threshold, or the like. In some examples, the threshold amount of time can be user-configurable. For example, a user may wish to prevent switching the user device to present close captions if there was a single shout or scream from someone watching a scary movie or a brief loud noise from others in the vicinity (e.g., a car backfiring), but once the user-defined threshold amount of time (i.e. 3 seconds of sustained ambient noise) is determined, an audio transcription feature can remain on until a similar sustained lack of ambient noise is detected.

In other examples, the user device can determine that the time threshold is satisfied when the ambient noise level satisfies (e.g., exceeds) the ambient noise threshold for a percentage of a time period. For example, the user device can determine that the time threshold is satisfied if the ambient noise level exceeds the ambient noise threshold for percentage of a time period. As a particular example, if the percentage is 60% and the time period is one minute, then the time threshold can be satisfied if the ambient noise level exceeds the ambient noise threshold for a total of 36 seconds in the preceding minute.

In step 308, the system can determine that an audio transcription feature, e.g., closed captioning or the like, on a device displaying the content (e.g., display 121, mobile device 124, etc.) can be activated. In some aspects, the determination can comprise a determination that the ambient audio component satisfies the ambient audio component threshold. In an aspect, the user device can make the determination in other aspects, other devices in the system can make the decision.

Then, in step 310, the system can activate the audio transcription feature. In some aspects, activating the audio transcription feature can comprise sending a notification signal to the device displaying the content to cause the device displaying the content to enable the audio transcription feature. In other aspects, activating the audio transcription feature can comprise, for example, sending a notification signal to the content provider causing the content provider to provide content that comprises audio transcription.

The monitoring device can deactivate the audio transcription feature of the device displaying the content in response to a determination that the ambient audio component does not satisfy (e.g., does not exceed) the ambient audio component threshold. In some aspects, deactivating the audio transcription feature can comprise sending a notification signal to the device displaying the content to cause the device displaying the content to disable the audio transcription feature. In some aspects, the audio transcription feature can only be disabled if the ambient audio component continuously fails to satisfy the ambient audio component threshold for a predefined time period (e.g., 30 seconds).

Figure 4:
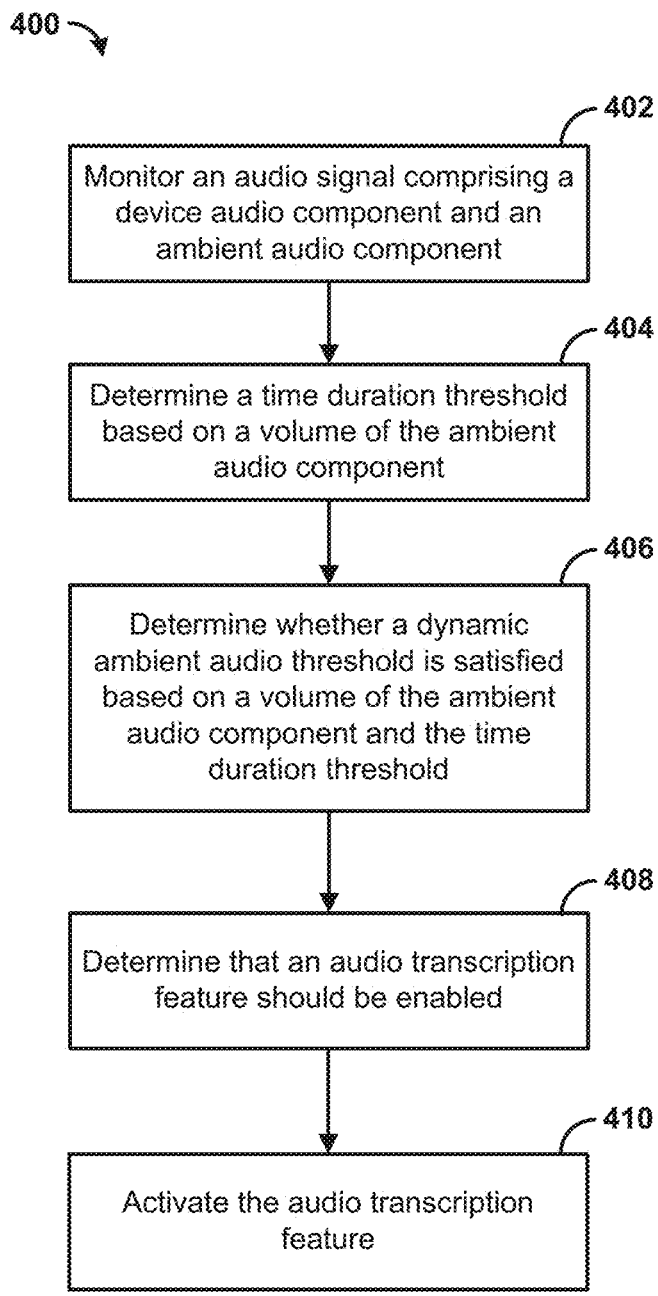
FIG. 4 is a flowchart illustrating an example method.

FIG. 4 shows an exemplary method 400. At step 402, a system comprising a device can monitor an audio signal. The device can comprise one or more of the media device 120, the display 121, the communication terminal 122, the mobile device 124, a set top box, a general or dedicated microphone or other audio capture device, and the like. In some examples, the monitored audio signal can comprise a device audio component from a device playing content (e.g., the display 121, the mobile device 124, etc.) and an ambient audio component from device and/or persons proximate to (e.g., within hearing distance of) a user. In other embodiments, the monitored audio can comprise ambient audio only (e.g., by positioning an audio capture device(s) to be exposed to only ambient noise, or by filtering out a device audio component, etc.). In some examples, the device can monitor the audio signal periodically (e.g., once per second, etc.). In other examples, the device can periodically receive a request from a device displaying the content (e.g., the display 121) to determine whether the dynamic ambient audio component threshold has been satisfied. The device can monitor the audio signal for a predetermined time (e.g., three to eight seconds) after receiving the request.

At step 404, the system can determine a time duration threshold. In some examples, the time duration threshold can be user-configurable or system-configurable. For example, a user may wish to prevent switching of the user device to present an audio transcription feature (e.g., closed captions or other types of audio representations), if there was a single loud noise of a short duration (e.g., a shout or scream from someone watching a scary movie, a car backfiring in the neighborhood of the user, etc.), but once the user-defined threshold amount of time (e.g., 3 seconds of sustained ambient noise) is determined, the audio transcription feature can remain on until a similar sustained lack of ambient noise is detected. The user configuration can allow for selection of a set time duration (e.g., 3 seconds). In other examples, the time duration threshold can be determined based on a volume of the ambient audio component. For example, while a brief, quiet conversation may not require activation of the audio transcription feature, prolonged conversation, even at relatively low volume, may be sufficiently distracting to warrant activation of the audio transcription feature for display on the user device. Conversely, when a vacuum is turned on, the user may wish to activate the audio transcription feature more quickly, since a vacuum is more likely to drown out all sound produced by the user device.

Determining the ambient audio component can comprise removing the device audio component from the audio signal, which comprises the ambient audio component and the device audio component. For example, the user device can receive the device audio component directly from the display 121 via, for example, a physical connection such as an HDMI connection, a digital audio connection, or the like. The device audio component can be subtracted from the audio signal, leaving only the ambient audio component. In particular, the device audio component received from the display 121 can be phase-inverted and combined with the audio signal to remove the device audio component based on the audio principle of phase cancellation or destructive interference, whereby two audio signals that are "out of phase," or inverted with respect to one another, cancel each other out. For example, combining the audio signal (e.g., the device audio component and the ambient audio component) with the phase-inverted device audio component causes the device audio component and the phase-inverted device audio component to cancel each other out, leaving only the ambient audio component.

The device audio component can typically comprise a relatively consistent volume. Accordingly, an average of the audio signal can be used to approximate the device audio component of the audio signal. As a specific example, the average audio signal can be calculated as a root mean square (RMS) average of the audio signal calculated over a predefined amount of time (e.g., one minute). In an example, determining the ambient audio component can comprise approximating the ambient audio component by subtracting the calculated average audio signal from the audio signal.

The user device can determine the time duration threshold based on the ambient audio component. For example, when the ambient audio component has a relatively high volume, (e.g., a high ambient noise level, such as a vacuum cleaner or garbage disposal) a relatively short time duration threshold can be determined; when the ambient audio component has a relatively low volume, (e.g., a low ambient noise level, such as a quiet conversation) a relatively long time duration threshold can be determined.

At step 406, the device can determine whether a dynamic ambient audio component threshold is satisfied based on the ambient audio component and the time duration threshold. Determining whether the ambient audio component satisfies the ambient audio component threshold can comprise determining whether the volume of the ambient audio component (e.g., the ambient noise level) exceeds a decibel value (e.g., an ambient noise threshold) specified by the ambient audio component threshold. In some examples, the ambient noise threshold can be a predefined absolute value (e.g., 60 dBA). In other examples, the ambient noise threshold value can be set dynamically. For example, the ambient noise threshold can be set as a percentage of the device audio component volume. As particular examples with the device audio component having a volume of 60 dBA, if the ambient noise threshold is 125% of the device audio component volume, then the ambient noise threshold is 75 dBA; if the ambient noise threshold is 80% of the device audio component volume, then the ambient noise threshold is 48 dBA.

Determining whether the ambient audio component has satisfied the dynamic ambient audio component threshold can further comprise, in response to determining that the ambient noise level satisfies (e.g., exceeds) the ambient noise threshold, determining whether the time duration threshold has been satisfied.

In some examples, the device can determine that the time duration threshold is satisfied when the ambient noise level exceeds the ambient noise threshold for the determined threshold amount of time. In other examples, the device can determine that the time duration threshold is satisfied when the ambient noise level satisfies (e.g., exceeds) the ambient noise threshold for a percentage of the determined time duration threshold. For example, the user device can determine that the time duration threshold is satisfied if the ambient noise level exceeds the ambient noise threshold for percentage of a time period. As a particular example, if the percentage is 60% and the time duration is one minute, then the time duration threshold can be satisfied if the ambient noise level exceeds the ambient noise threshold for a total of 36 seconds in a preceding minute.

At step 408, the system can determine that a device displaying the content (e.g., the display 121) should enable an audio transcription (e.g., closed captioning or any other audio to visible text translation) feature in response to a determination that the ambient audio component satisfies the dynamic ambient audio component threshold. In an aspect, the user device can make the determination in other aspects, other devices in the system can make the decision.

Then, in step 410, the system can activate the audio transcription feature. In some aspects, activating the audio transcription feature can comprise sending a notification signal to the device displaying the content to cause the device displaying the content to enable the audio transcription feature. In other aspects, activating the audio transcription feature can comprise, for example, sending a notification signal to the content provider causing the content provider to provide content that comprises audio transcription.

The system can deactivate the audio transcription feature in response to a determination that the ambient audio component does not satisfy the dynamic ambient audio component threshold. In some examples, deactivating the audio transcription feature can comprise sending a notification signal to the device displaying the content to cause the device displaying the content to disable the audio transcription feature. In other aspects, deactivating the audio transcription feature can comprise, for example, sending a notification signal to the content provider causing the content provider to provide content that lacks audio transcription. In some examples, the audio transcription feature can only be disabled if the ambient audio component continuously fails to satisfy the dynamic ambient audio component threshold for a predefined time period (e.g., 30 seconds).

Figure 5:
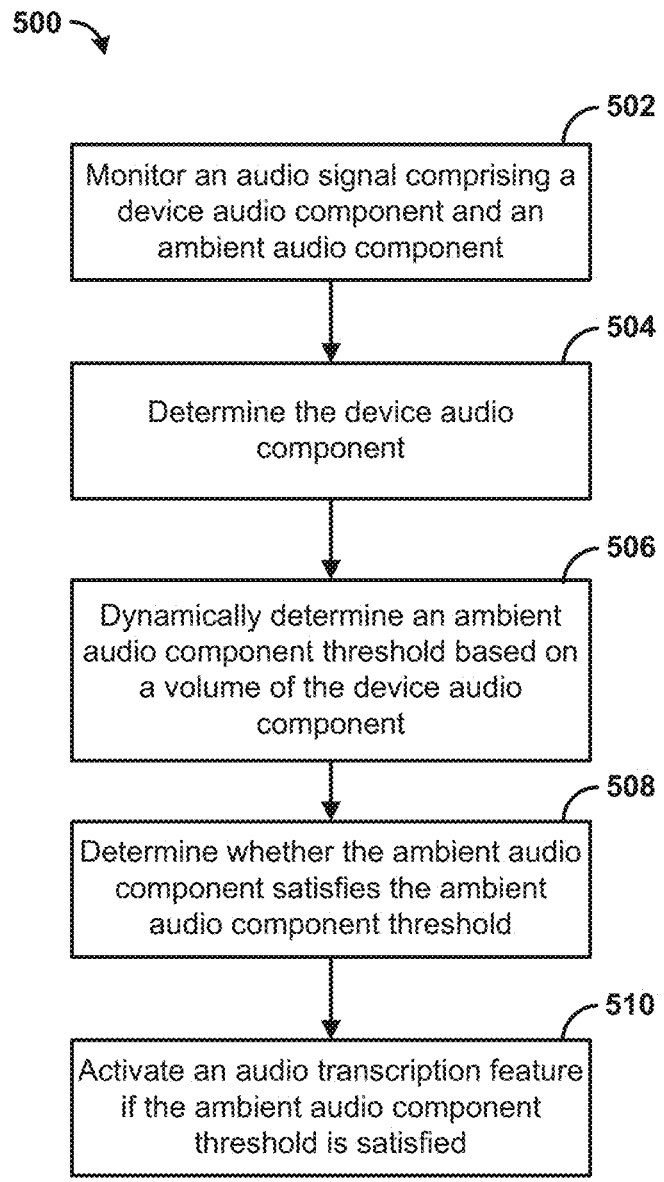
FIG. 5 is a flowchart illustrating an example method.

FIG. 5 shows an exemplary method 500. At step 502, a system can comprise a device that can monitor an audio signal. The device can comprise one or more of the media device 120, the display 121, the communication terminal 122, the mobile device 124, a set top box, and the like. In some examples, the audio signal can comprise a device audio component from a device playing content (e.g., the display 121, the mobile device 124, etc.) and/or an ambient audio component from device and/or persons proximate to (e.g., within hearing distance of) a user. In some examples, the device can monitor the audio signal periodically (e.g., once per millisecond, once per second, etc.). In other examples, the device can periodically receive a request to determine whether the dynamic ambient audio component threshold has been satisfied from the device playing the content (e.g., the display 121, the mobile device 124, etc.). The device can monitor the audio signal for a predetermined time (e.g., one minute) after receiving the request.

At step 504, the system can determine a device audio component of the monitored audio signal. The device audio component of the audio signal can be provided directly to the device (e.g., by the device receiving, processing, or displaying the content). For example, the device can be connected to an audio output of the device displaying the content (e.g., via an HDMI cable, a digital audio cable, and/or the like). In some embodiments, there may be one or more device audio components associated with one or more user devices.

The device audio component can typically comprise a relatively consistent volume. Accordingly, an average of the audio signal can be used to approximate the device audio component of the audio signal. As a specific example, the average audio signal can be calculated as a root mean square (RMS) average of the audio signal calculated over a predefined amount of time (e.g., one minute). In an example, determining the ambient audio component can comprise approximating the ambient audio component by subtracting the calculated average audio signal from the audio signal. In some examples, alternative processes, such as peak-to-peak can be used to determine the average audio signal.

At step 506. The system can dynamically determine an ambient audio component threshold based on a volume of the device audio component as well as any ambient noise. The ambient audio component threshold can comprise an ambient noise threshold and a time threshold. One or more of the ambient noise threshold and the time threshold can be determined dynamically.

The ambient noise threshold can be set based on one or more of a user selection (e.g., using the interface 200) and the volume of the device audio component. In some examples, the ambient noise threshold can be a predefined absolute value (e.g., 60 dBA). In other examples, the ambient noise threshold value can be set dynamically. For example, the ambient noise threshold can be set as a percentage of the device audio component volume. As particular examples with the device audio component having a volume of 60 dBA, if the ambient noise threshold is 125% of the device audio component volume, then the ambient noise threshold is 75 dBA; if the ambient noise threshold is 80% of the device audio component volume, then the ambient noise threshold is 48 dBA.

In some examples, the time threshold can be set or adjusted based on the volume of the device audio component. For example, the time threshold can be set such that a time duration value of the time threshold is relatively low in response to a relatively low device audio component volume; the time threshold can be set such that the time duration value is relatively high in response to a relatively high device audio component volume. For example, this can reflect a user compensating for some ambient noise (e.g., a quiet conversation) by increasing the user device volume output instead of engaging the audio transcription display. In other examples, the time threshold can be set to have a constant time duration value (e.g., one minute), regardless of the device audio component volume. For example, the time threshold can be user-configurable.

At step 508, the system can determine whether the ambient audio component satisfies the ambient component threshold determined in step 506. The ambient audio component can be determined by subtracting the one or more device audio components determined in step 504 from the audio signal. To determine whether the ambient audio component satisfies the ambient audio component threshold, the user device can determine whether a volume of the ambient audio component satisfies (e.g., exceeds) the ambient noise threshold.

In response to a determination that the ambient noise threshold is satisfied, the system can determine whether the time threshold is satisfied. In some examples, the system can determine that the time threshold is satisfied when the ambient noise level continuously exceeds the ambient noise threshold for the determined time duration value amount of time. In other examples, the system can determine that the time duration threshold is satisfied when the ambient noise level satisfies (e.g., exceeds) the ambient noise threshold for a percentage of the determined time duration value. For example, the device can determine that the time duration threshold is satisfied if the ambient noise level exceeds the ambient noise threshold for percentage of a time period. As a particular example, if the percentage is 60% and the time period is one minute, then the time duration threshold can be satisfied if the ambient noise level exceeds the ambient noise threshold for a total of 36 seconds in a preceding minute.

At step 510, the user device can activate an audio transcription feature (e.g., closed caption feature or any other audio to visible text translation). For example, the audio transcription feature could be a feature of a device displaying the content (e.g., display 121, mobile device 124, etc.) or any other device in the system. In some aspects, the audio transcription feature can be activated in response to a determination that the ambient audio component satisfies the ambient audio component threshold. Activating the audio transcription function can comprise sending a notification signal to the device displaying the content to cause the device displaying the content to enable an audio transcription feature. In other aspects, activating the audio transcription feature can comprise, for example, sending a notification signal to the content provider causing the content provider to provide content that comprises audio transcription.

In some examples, the device can deactivate the audio transcription feature of the device displaying the content in response to a determination that the ambient audio component does not satisfy the ambient audio component threshold (e.g., the ambient audio component does not satisfy one or more of the ambient noise threshold and the time threshold). In some examples, deactivating the audio transcription feature can comprise sending a notification signal to the device displaying the content to cause the device displaying the content to disable the audio transcription feature. In other aspects, deactivating the audio transcription feature can comprise, for example, sending a notification signal to the content provider causing the content provider to provide content that lacks audio transcription. In some examples, the audio transcription feature can only be disabled if the ambient audio component continuously fails to satisfy the ambient audio component threshold for a predefined time period (e.g., 30 seconds).

Figure 6:
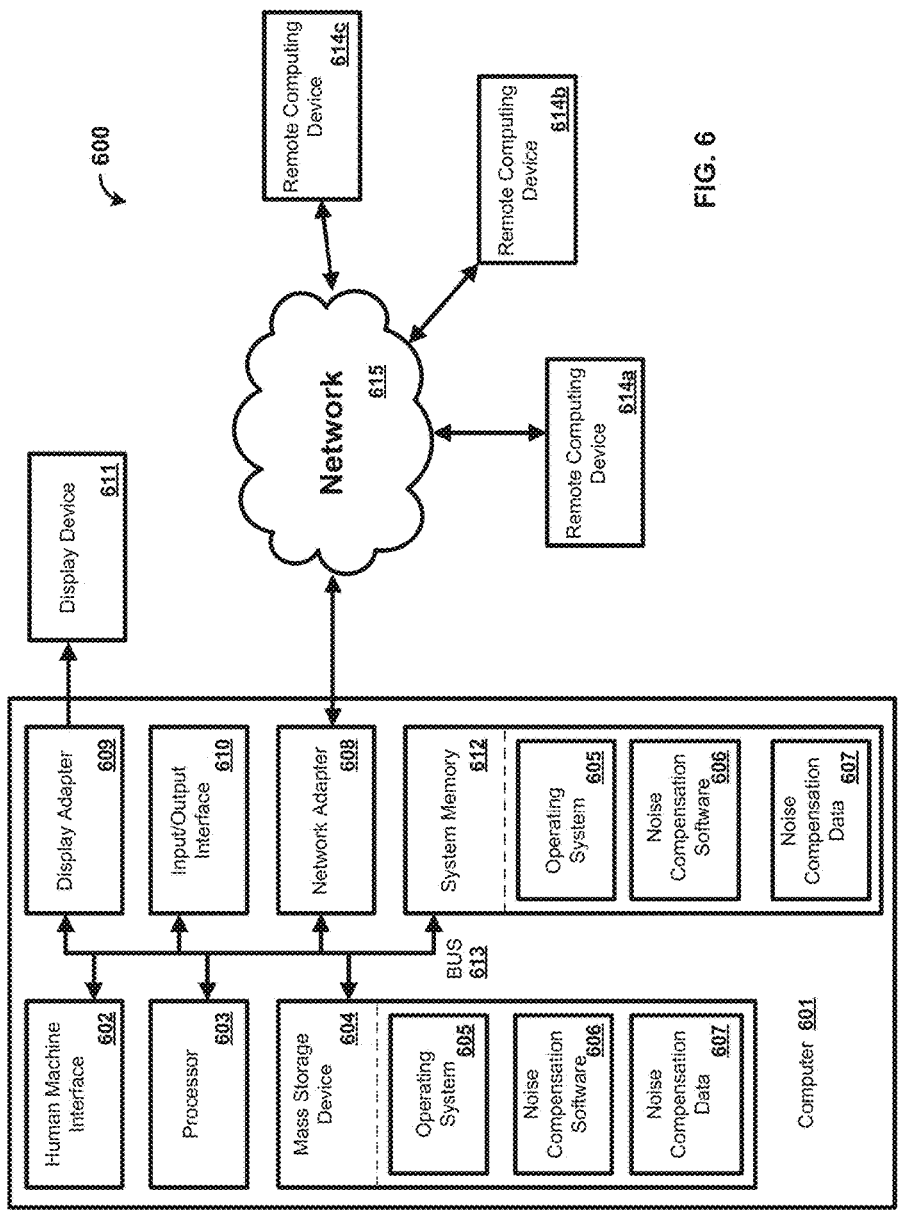
FIG. 6 is a block diagram illustrating an example computing device.

In an exemplary aspect, the methods and systems can be implemented on a computer 601 as illustrated in FIG. 6 and described below. By way of example, one or more of the media device 120, the display 121, the communication terminal 122, and the mobile device 124 of FIG. 1 can be a computer as illustrated in FIG. 6. Similarly, the methods and systems disclosed can utilize one or more computers to perform one or more functions in one or more locations. FIG. 6 is a block diagram illustrating an exemplary operating environment for performing the disclosed methods. This exemplary operating environment is only an example of an operating environment and is not intended to suggest any limitation as to the scope of use or functionality of operating environment architecture. Neither should the operating environment be interpreted as having any dependency or requirement relating to any one or combination of components illustrated in the exemplary operating environment.

The present methods and systems can be operational with numerous other general purpose or special purpose computing system environments or configurations. Examples of well known computing systems, environments, and/or configurations that can be suitable for use with the systems and methods comprise, but are not limited to, personal computers, server computers, laptop devices, and multiprocessor systems. Additional examples comprise set top boxes, programmable consumer electronics, network PCs, minicomputers, mainframe computers, distributed computing environments that comprise any of the above systems or devices, and the like.

The processing of the disclosed methods and systems can be performed by software components. The disclosed systems and methods can be described in the general context of computer-executable instructions, such as program modules, being executed by one or more computers or other devices. Generally, program modules comprise computer code, routines, programs, objects, components, data structures, etc. that perform particular tasks or implement particular abstract data types. The disclosed methods can also be practiced in grid-based and distributed computing environments where tasks are performed by remote processing devices that are linked through a communications network. In a distributed computing environment, program modules can be located in both local and remote computer storage media including memory storage devices.

Further, one skilled in the art will appreciate that the systems and methods disclosed herein can be implemented via a general-purpose computing device in the form of a computer 601. The components of the computer 601 can comprise, but are not limited to, one or more processors 603, a system memory 612, and a system bus 613 that couples various system components including the one or more processors 603 to the system memory 612. The system can utilize parallel computing.

The system bus 613 represents one or more of several possible types of bus structures, including a memory bus or memory controller, a peripheral bus, an accelerated graphics port, or local bus using any of a variety of bus architectures. By way of example, such architectures can comprise an Industry Standard Architecture (ISA) bus, a Micro Channel Architecture (MCA) bus, an Enhanced ISA (EISA) bus, a Video Electronics Standards Association (VESA) local bus, an Accelerated Graphics Port (AGP) bus, and a Peripheral Component Interconnects (PCI), a PCI-Express bus, a Personal Computer Memory Card Industry Association (PCM-CIA), Universal Serial Bus (USB) and the like. The bus 613, and all buses specified in this description can also be implemented over a wired or wireless network connection and each of the subsystems, including the one or more processors 603, a mass storage device 604, an operating system 605, noise compensation software 606, noise compensation data 607, a network adapter 608, the system memory 612, an Input/Output Interface 610, a display adapter 609, a display device 611, and a human machine interface 602, can be contained within one or more remote computing devices 614*a,b,c* at physically separate locations, connected through buses of this form, in effect implementing a fully distributed system.

The computer 601 typically comprises a variety of computer readable media. Exemplary readable media can be any available media that is accessible by the computer 601 and comprises, for example and not meant to be limiting, both volatile and non-volatile media, removable and non-removable media. The system memory 612 comprises computer readable media in the form of volatile memory, such as random access memory (RAM), and/or non-volatile memory, such as read only memory (ROM). The system memory 612 typically contains data such as the noise compensation data 607 and/or program modules such as the operating system 605 and the noise compensation software 606 that are immediately accessible to and/or are presently operated on by the one or more processors 603.

In another aspect, the computer 601 can also comprise other removable/non-removable, volatile/non-volatile computer storage media By way of example, FIG. 6 illustrates the mass storage device 604 which can provide non-volatile storage of computer code, computer readable instructions, data structures, program modules, and other data for the computer 601. For example and not meant to be limiting, the mass storage device 604 can be a hard disk, a removable magnetic disk, a removable optical disk, magnetic cassettes or other magnetic storage devices, flash memory cards, CD-ROM, digital versatile disks (DVD) or other optical storage, random access memories (RAM), read only memories (ROM), electrically erasable programmable read-only memory (EEPROM), and the like.

Optionally, any number of program modules can be stored on the mass storage device 604, including by way of example, the operating system 605 and the noise compensation software 606. Each of the operating system 605 and the noise compensation software 606 (or some combination thereof) can comprise elements of the programming and the noise compensation software 606. The noise compensation data 607 can also be stored on the mass storage device 604. The noise compensation data 607 can be stored in any of one or more databases known in the art. Examples of such databases comprise, DB2®, Microsoft® Access, Microsoft® SQL Server, Oracle®, mySQL, PostgreSQL, and the like. The databases can be centralized or distributed across multiple systems.

In another aspect, the user can enter commands and information into the computer 601 via an input device (not shown). Examples of such input devices comprise, but are not limited to, a keyboard, pointing device (e.g., a "mouse"), a microphone, a joystick, a scanner, tactile input devices such as gloves, and other body coverings, and the like These and other input devices can be connected to the one or more processors 603 via the human machine interface 602 that is coupled to the system bus 613, but can be connected by other interface and bus structures, such as a parallel port, game port, an IEEE 1394 Port (also known as a Firewire port), a serial port, or a universal serial bus (USB).

In yet another aspect, the display device 611 can also be connected to the system bus 613 via an interface, such as the display adapter 609. It is contemplated that the computer 601 can have more than one display adapter 609 and the computer 601 can have more than one display device 611. For example, the display device 611 can be a monitor, an LCD (Liquid Crystal Display), or a projector. In addition to the display device 611, other output peripheral devices can comprise components such as speakers (not shown) and a printer (not shown) which can be connected to the computer 601 via the Input/Output Interface 610. Any step and/or result of the methods can be output in any form to an output device. Such output can be any form of visual representation, including, but not limited to, textual, graphical, animation, audio, tactile, and the like. The display device 611 and computer 601 can be part of one device, or separate devices.

The computer 601 can operate in a networked environment using logical connections to one or more remote computing devices 614*a,b,c*. By way of example, a remote computing device can be a personal computer, portable computer, smartphone, a server, a router, a network computer, a peer device or other common network node, and so on. Logical connections between the computer 601 and a remote computing device 614*a,b,c* can be made via a network 615, such as a local area network (LAN) and/or a general wide area network (WAN). Such network connections can be through the network adapter 608. The network adapter 608 can be implemented in both wired and wireless environments. Such networking environments are conventional and commonplace in dwellings, offices, enterprise-wide computer networks, intranets, and the Internet.

For purposes of illustration, application programs and other executable program components such as the operating system 605 are illustrated herein as discrete blocks, although it is recognized that such programs and components reside at various times in different storage components of the computing device 601, and are executed by the one or more processors 603 of the computer. An implementation of the noise compensation software 606 can be stored on or transmitted across some form of computer readable media. Any of the disclosed methods can be performed by computer readable instructions embodied on computer readable media. Computer readable media can be any available media that can be accessed by a computer. By way of example and not meant to be limiting, computer readable media can comprise "computer storage media" and "communications media." "Computer storage media" comprise volatile and non-volatile, removable and non-removable media implemented in any methods or technology for storage of information such as computer readable instructions, data structures, program modules, or other data. Exemplary computer storage media comprises, but is not limited to, RAM, ROM, EEPROM, flash memory or other memory technology, CD-ROM, digital versatile disks (DVD) or other optical storage, magnetic cassettes, magnetic tape, magnetic disk storage or other magnetic storage devices, or any other medium which can be used to store the desired information and which can be accessed by a computer.

The methods and systems can employ Artificial Intelligence techniques such as machine learning and iterative learning. Examples of such techniques include, but are not limited to, expert systems, case based reasoning, Bayesian networks, behavior based AI, neural networks, fuzzy systems, evolutionary computation (e.g. genetic algorithms), swarm intelligence (e.g. ant algorithms), and hybrid intelligent systems (e.g. Expert inference rules generated through a neural network or production rules from statistical learning).

While the methods and systems have been described in connection with preferred embodiments and specific examples, it is not intended that the scope be limited to the particular embodiments set forth, as the embodiments herein are intended in all respects to be illustrative rather than restrictive.

Unless otherwise expressly stated, it is in no way intended that any method set forth herein be construed as requiring that its steps be performed in a specific order. Accordingly, where a method claim does not actually recite an order to be followed by its steps or it is not otherwise specifically stated in the claims or descriptions that the steps are to be limited to a specific order, it is in no way intended that an order be inferred, in any respect. This holds for any possible non-express basis for interpretation, including: matters of logic with respect to arrangement of steps or operational flow; plain meaning derived from grammatical organization or punctuation; the number or type of embodiments described in the specification.

It will be apparent to those skilled in the art that various modifications and variations can be made without departing from the scope or spirit. Other embodiments will be apparent to those skilled in the art from consideration of the specification and practice disclosed herein. It is intended that the specification and examples be considered as exemplary only, with a true scope and spirit being indicated by the following claims.

What is claimed is:

1. A method comprising:
monitoring an audio signal comprising a device audio component from a device presenting content and an ambient audio component;
determining the ambient audio component of the audio signal;
determining whether the ambient audio component satisfies an ambient noise threshold;
determining whether a dynamic time threshold is satisfied, wherein the dynamic time threshold is based on a volume of the ambient audio component, wherein the dynamic time threshold decreases as the volume of the ambient audio component increases;
in response to the ambient noise threshold and the dynamic time threshold being satisfied, activating an audio transcription feature of the device; and
in response to determining that the ambient audio component no longer satisfies the ambient noise threshold for a period of time, deactivating the activated audio transcription feature of the device.

2. The method of claim 1, wherein the dynamic time threshold is satisfied when the ambient audio component satisfies the ambient noise threshold for a predefined percentage of a time period.

3. The method of claim 1, wherein determining the ambient audio component comprises removing the device audio component from the audio signal.

4. The method of claim 1, wherein determining the ambient audio component further comprises subtracting an average audio signal from the audio signal.

5. The method of claim 1, wherein the ambient noise threshold is determined based on a volume of the device audio component.

6. The method of claim 1, wherein the period of time is a dynamic time period based on the volume of the ambient audio component, wherein the dynamic time period increases in relation to an increase in the volume of the ambient audio component.

7. The method of claim 1, wherein the dynamic time threshold is further based on a volume of the device audio component.

8. A method comprising:
monitoring an audio signal comprising a device audio component from a device presenting content and an ambient audio component;
determining a dynamic time duration threshold based on a volume of the ambient audio component, wherein the dynamic time duration threshold is based on an ambient noise level being above a dynamic ambient audio component threshold;
determining, based on the ambient audio component and the dynamic time duration threshold, whether the ambient audio component satisfies the dynamic ambient audio component threshold, wherein the dynamic time duration threshold decreases as the volume of the ambient audio component increases;
sending, to a system component associated with the device, a notification to enable an audio transcription feature of the device when the dynamic ambient audio component threshold is satisfied; and
in response to determining that the ambient audio component no longer satisfies the dynamic ambient audio component threshold for a period of time, sending a notification to the system component associated with the device to disable the enabled audio transcription feature of the device.

9. The method of claim 8, further comprising periodically receiving, from the device presenting the content, a request to determine whether the dynamic ambient audio component threshold is satisfied.

10. The method of claim 9, wherein monitoring the audio signal comprises monitoring the audio signal for a predetermined time after receiving the request.

11. The method of claim 8, wherein determining whether the ambient audio component satisfies the dynamic ambient audio component threshold, comprises:
determining the ambient audio component from the audio signal;
determining the volume of the ambient audio component;
determining whether the volume of the ambient audio component satisfies the dynamic ambient audio component threshold; and
determining whether the dynamic time duration threshold is satisfied.

12. The method of claim 8, wherein the ambient noise level is measured in decibels.

13. The method of claim 8, wherein the dynamic ambient audio component threshold is dynamically based on the device audio component.

14. The method of claim 8, wherein the period of time is a dynamic time period based on the volume of the ambient audio component, wherein the dynamic time period increases in relation to an increase in the volume of the ambient audio component.

15. A method comprising:
monitoring an audio signal comprising a device audio component from a device presenting content and an ambient audio component;
determining the device audio component of the audio signal;
dynamically determining, based on a volume of the device audio component, an ambient audio component threshold, wherein the ambient audio component threshold comprises a dynamic time threshold that decreases as a volume of the ambient audio component increases;
determining whether the ambient audio component satisfies the ambient audio component threshold;
in response to the ambient audio component satisfying the ambient audio component threshold, activating an audio transcription feature of the device; and
in response to determining that the ambient audio component no longer satisfies the ambient audio component threshold for a period of time, deactivating the activated audio transcription feature of the device.

16. The method of claim 15, wherein determining whether the ambient audio component satisfies the ambient audio component threshold comprises:
- determining whether an ambient noise level of the ambient audio component satisfies an ambient noise threshold; and
- in response to determining that the ambient noise level of the ambient audio component satisfies the ambient noise threshold, determining whether the dynamic time threshold has been satisfied.

17. The method of claim 16, wherein the ambient noise level is measured in decibels.

18. The method of claim 15, wherein in response to the ambient audio component satisfying the ambient audio component threshold, activating the audio transcription feature of the device, comprises sending a notification to the device to enable the audio transcription feature of the device.

19. The method of claim 15, wherein the ambient audio component threshold is proportional to a volume of the device audio component.

20. The method of claim 15, wherein the period of time is a dynamic time period based on the volume of the ambient audio component, wherein the dynamic time period increases in relation to an increase in the volume of the ambient audio component.

* * * * *